US006932616B1

(12) United States Patent
Swantner et al.

(10) Patent No.: US 6,932,616 B1
(45) Date of Patent: Aug. 23, 2005

(54) CONNECTOR WITH INTEGRAL EMI SHIELD

(75) Inventors: Michael J. Swantner, Warren, PA (US); Douglas G. Seymour, York, PA (US); Shane Brown, York, PA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 10/913,858

(22) Filed: Aug. 7, 2004

Related U.S. Application Data

(60) Provisional application No. 60/570,155, filed on May 12, 2004.

(51) Int. Cl.[7] .......................... H01R 12/00; H05K 1/00
(52) U.S. Cl. ......................... 439/63; 439/581; 439/607
(58) Field of Search ........................... 439/63, 581, 607

(56) References Cited

U.S. PATENT DOCUMENTS

| | | | | |
|---|---|---|---|---|
| 4,502,749 | A * | 3/1985 | Forney, Jr. et al. | 439/581 |
| 4,605,269 | A * | 8/1986 | Cohen et al. | 439/63 |
| 4,684,200 | A * | 8/1987 | Capp | 439/387 |
| 5,011,415 | A * | 4/1991 | Suzuki et al. | 439/63 |
| 5,860,812 | A * | 1/1999 | Gugliotti | 439/63 |
| 6,164,977 | A * | 12/2000 | Lester | 439/63 |
| 6,305,947 | B1 * | 10/2001 | Bruce | 439/63 |
| 6,822,542 | B2 * | 11/2004 | Clark et al. | 333/260 |

* cited by examiner

*Primary Examiner*—Hae Moon Hyeon
(74) *Attorney, Agent, or Firm*—Kenneth D. Labudda

(57) ABSTRACT

A right-angled connector comprises a subassembly (10) including an electrically conductive member or ground shell (12) having a longitudinal section (12*a*) and a transverse section (12*b*). The longitudinal section (12*a*) is provided with a longitudinal axis (13) and at least a portion (14) of the member (12) provides a cylindrical, hollow end (16). A trough (18) is formed in the member (12) to accommodate an electrically conductive contact pin (18*a*) and at least one leg (19) is provided on member (12) extending in a direction transverse to the longitudinal axis (13). In a preferred embodiment the member (12) has four legs (19), as shown in FIGS. 2 and 5, which in the final construction will provide the ground connections for the connector. Member (12) can be die cast zinc. Member (12) additionally is provided with an integral electromagnetic interference shield in the form of oppositely disposed wings (100, 102), which project from the hollow cylindrical end 16. Four apertures, (104, 106, 108 and 110) are provided in the wings.

5 Claims, 3 Drawing Sheets

CONNECTOR WITH INTEGRAL EMI SHIELD

This application claims priority from Provisional Application No. 60/570,155, filed May 12, 2004.

TECHNICAL FIELD

This invention relates to electrical connectors and more particularly to such connectors for receiving a coaxial cable contact. More particularly, it relates to right angle connectors having integral shielding for electromagnetic interference (EMI) for use with printed circuit boards and still more particularly it relates to use connectors suitable for use in high frequency applications.

BACKGROUND ART

Electrical connectors, particularly right angled connectors for attachment to printed circuit boards (hereafter, PCB or PCBs) for receiving coaxial cable contacts, for example, for connecting automotive radio antennas, are known. These connectors have worked well in the past; however, they were expensive because of the number of parts they entailed. Such connectors are shown, for example, in U.S. Pat. No. 6,386, 888. This latter connector comprises a metal bracket, a metal shell, a plastic insulator, a plastic cover and a contact. While this connector works well under normal conditions, test requirements for this connector require that it be plugged into a mating connector on a coaxial cable. This mating connector's cable is then pulled at a defined force through multiple angles. Often, the interface of the cover to the bracket will fail before the required forces are met. It is believed that this failure occurs because of the difficulty in maintain critical tolerances between the multiple parts.

Such problems were addressed in a modified connector shown in co-pending patent application Ser. No. 10/783,566, filed Feb. 20, 2004, and assigned to the assignee of the instant invention.

While the latter connector solves many of the mechanical problems of the former connector and functions very well, a need exists for such connectors to operate at higher frequencies with a design formulated to reduce or eliminate electromagnetic interference (EMI).

DISCLOSURE OF INVENTION

It is, therefore, an object of the invention to obviate the disadvantages of the prior art.

It is another object of the invention to enhance electromagnetic shielding on electrical connectors.

These objects are accomplished, in one aspect of the invention, by the provision of a connector comprising: an electrically conductive member having a longitudinal section and a transverse section, at least a portion of the longitudinal section providing a cylindrical hollow end and the transverse section having four protruding legs for engagement with circuit traces on a painted circuit board, the conductive member additionally being provided with an integral electromagnetic interference (EMI) shield in the form of oppositely disposed wings; an electrically conductive pin positioned with respect to the electrically conductive member, a first part of the electrically conductive pin being substantially centrally located within the hollow end and a second part of the electrically conductive pin extending transversely and substantially parallel to the four legs; and a single-piece electrically insulating body surrounding the electrically conductive member and the electrically conductive pin.

The integrally formed EMI shield prevents the escape of electromagnetic interference from the connector during its operational phase, greatly increasing its utility.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
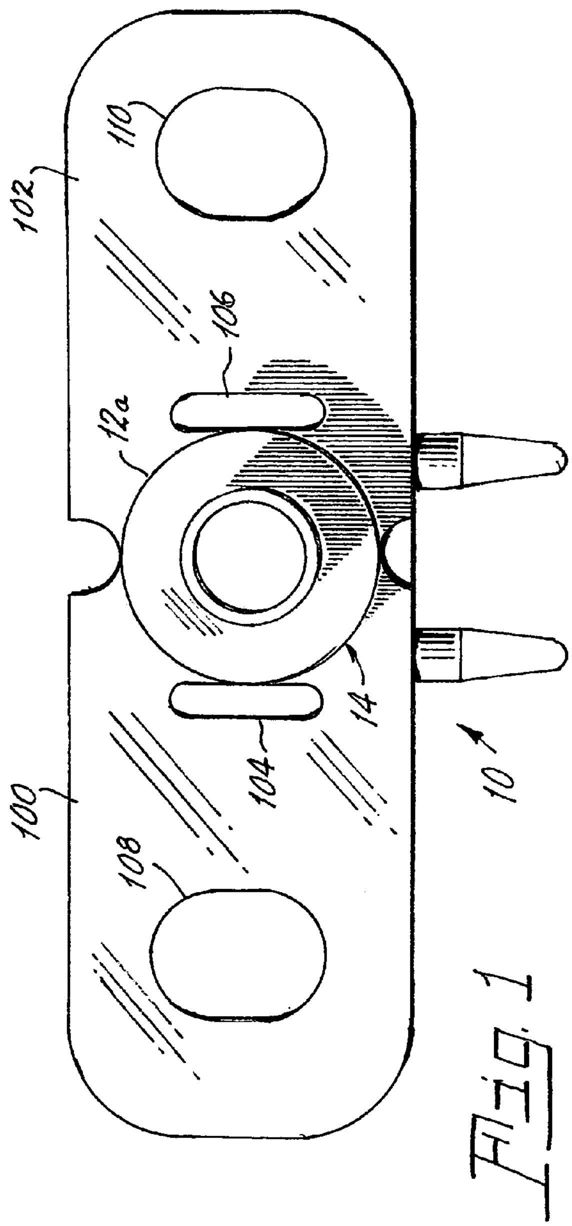
FIG. 1 is an elevational view of an electrically conductive member or ground shell.
Figure 2:
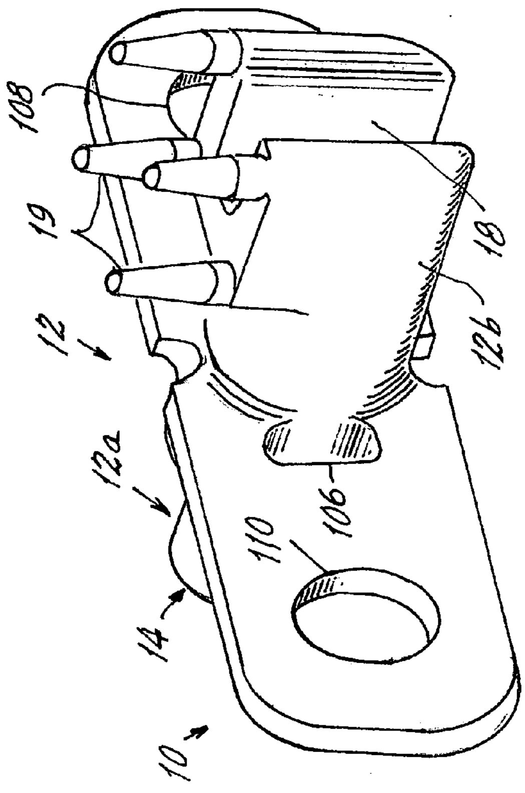
FIG. 2 is a perspective view of the ground shell of FIG. 1 in a reverse orientation.
Figure 3:
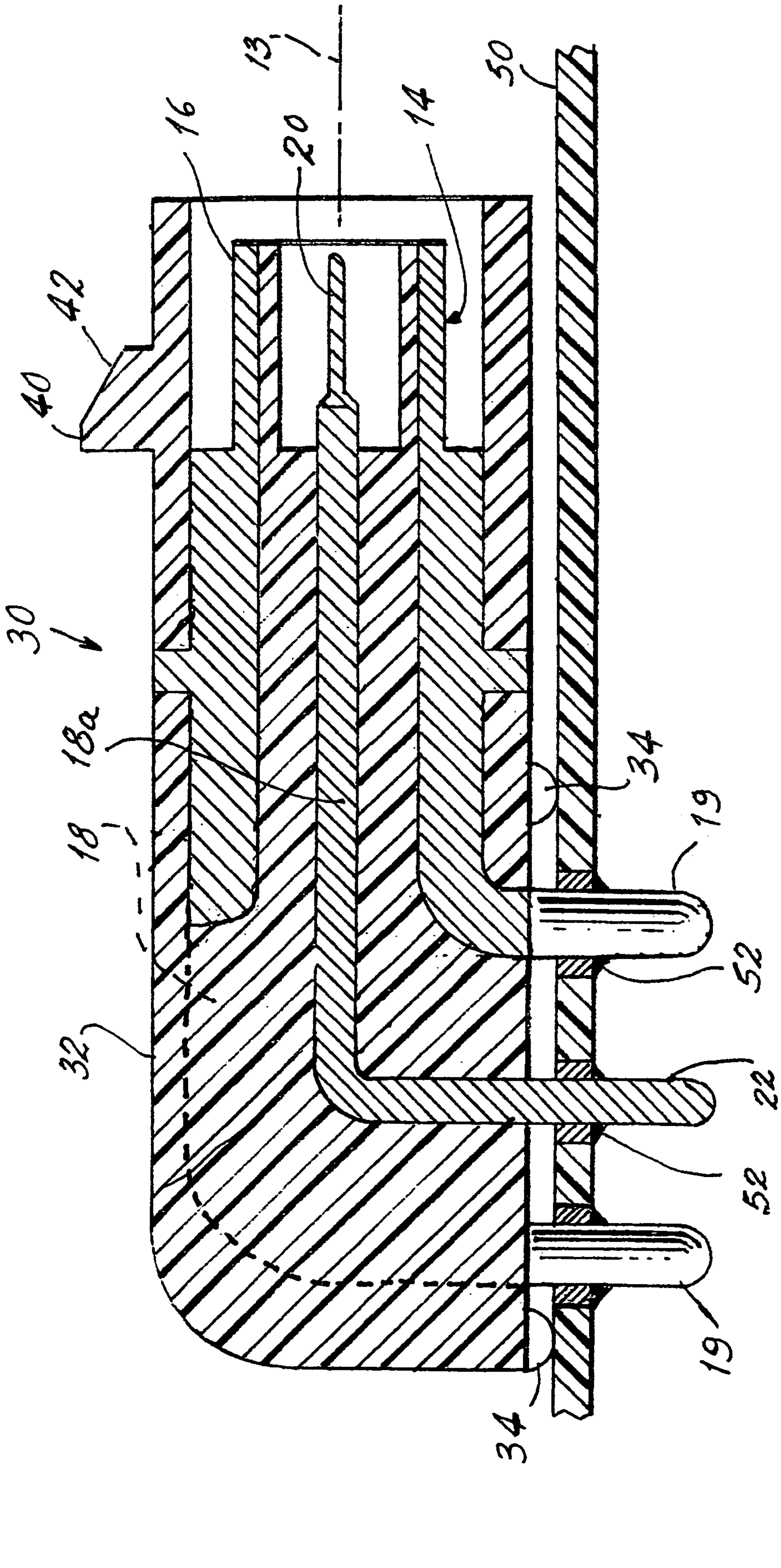
FIG. 3 is a modified, longitudinal sectional view of a completed connector.
Figure 4:
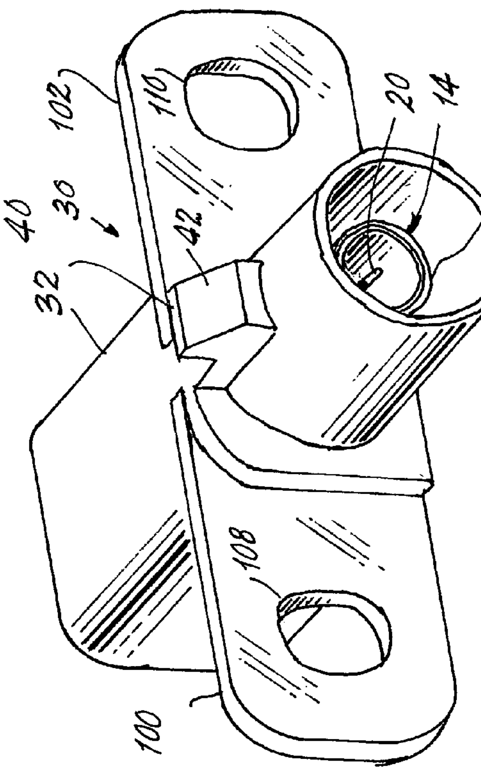
FIG. 4 is a perspective view of a completed connector in a first orientation.
Figure 5:
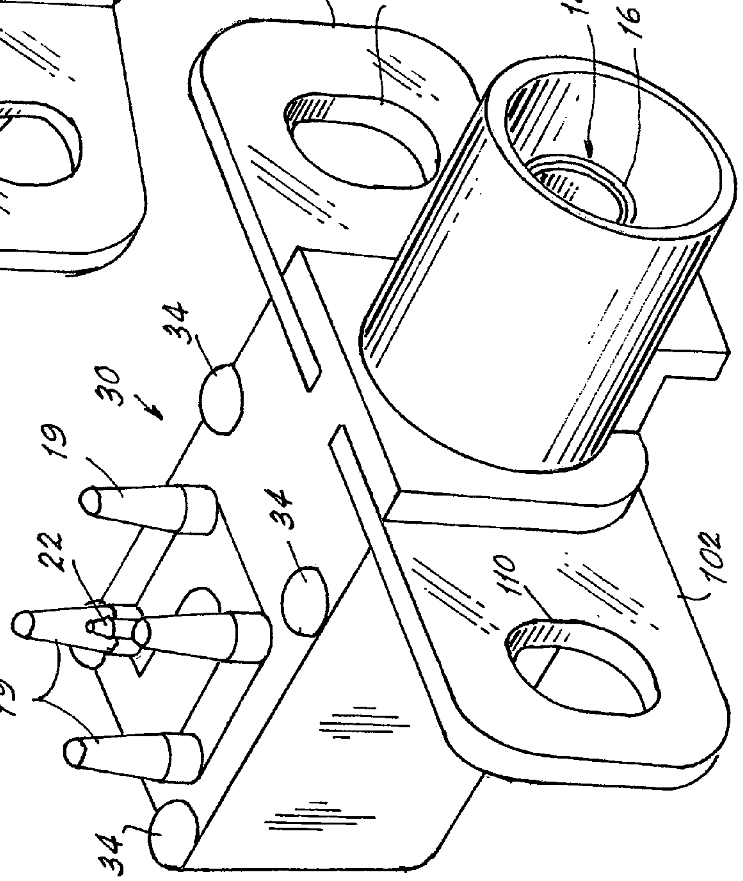
FIG. 5 is a perspective view of a completed connector in an inverted orientation.

Referring now to the drawings with greater particularity, there is shown in FIG. 1 a right-angled electrical connector. Specifically, a right-angled connector in accordance with an aspect of the invention comprises a subassembly 10 including an electrically conductive member or ground shell 12 having a longitudinal section 12*a* and a transverse section 12*b*. The longitudinal section 12*a* is provided with a longitudinal axis 13 and at least a portion 14 of the member 12 provides a cylindrical, hollow end 16. A trough 18 is formed in the member 12 to accommodate an electrically conductive contact pin 18*a* and at least one leg 19 is provided on member 12 extending in a direction transverse to the longitudinal axis 13. In a preferred embodiment of the invention the member 12 has four legs 19, as shown in FIGS. 2 and 5, which in the final construction will provide the ground connections for the connector, as will be explained hereafter. Member 12 can be any electrically conductive material but in a preferred embodiment of the invention it is die cast zinc.

Member 12 additionally is provided with an integral electromagnetic interference shield in the form of oppositely disposed wings 100, 102, which project from the hollow cylindrical end 16. Four apertures, 104, 106, 108 and 110 are provided in the wings.

Pin 18*a* has a first longitudinal part 20 that is substantially centrally located in the hollow end 16 and the trough 18; that is, the first longitudinal part 20 is coaxial with the axis 13, and the pin 18*a* has a second part 22 that, in the right-angled connector shown, projects in a direction transverse to the longitudinal direction and the axis 13 and which, in the finished connector, will provide the electrical connection to the contact pin. Contact pin 18*a* can be any conductive material but is preferably brass.

To complete a connector 30, the subassembly 10 is mounted in a suitable mold cavity with the pin 18*a* held in its appropriate position by tooling, not shown.

The single-piece, electrically insulating body 32 is then over-molded around the subassembly 10. The body 32 can take any appropriate or desired configuration but in a preferred embodiment includes at least two and preferably four spacing feet 34. The over-molded material penetrates the openings 104 and 106 to complete a secure bond to the ground shell 12, while the apertures 108 and 110 remain open and can be used for additional mounting accessories such as bolts or screws.

A tab 40 with a ramp 42 can also be provided to lock in a suitable opening in a mating connector.

In use the connector 30 is mounted upon a PCB 50 with the four legs 19 and the second part 22 of pin 18*a* engaging plated-through holes in the PCB. The spacing feet 34 are in contact with one surface of the PCB and serve to provide consistent spacing for the connector 30. After mounting the connector 30 to the PCB 50 appropriate solder 52 can be applied to insure adequate electrical connection to the legs 19 and the second part 22 of contact 18*a*.

The integrally formed wings 100, 102 provide superior EMI shielding that cannot be accomplished with add-on brackets. The apertures 108 and 110 also insure that additional mounting brackets are not required.

While there have been shown and described what are present considered to be the preferred embodiments of the invention, it will be apparent to those skilled in the art that various changes and modifications can be made herein without departing from the scope of the invention as defined by the appended claims.

What is claimed is:

1. A connector comprising:

an electrically conductive member having a longitudinal section and a transverse section, at least a portion of said longitudinal section providing a cylindrical hollow end and said transverse section having four protruding legs for engagement with circuit traces on a printed circuit board, said conductive member additionally being provided with an integral electromagnetic shield in the form of oppositely disposed wings;

an electrically conductive pin positioned with respect to said electrically conductive member, a first part of said electrically conductive pin being substantially centrally located within said hollow end and a second part of said electrically conductive pin extending transversely and substantially parallel to said four legs; and a single-piece electrically insulating body surrounding said electrically conductive member and said electrically conductive pin.

2. The connector of claim 1 wherein said wings extend from said cylindrical hollow end and include at least two openings adjacent said hollow end, said single piece electrically insulating body penetrating said at least two openings.

3. The connector of claim 1 wherein said connector is a right-angle connector.

4. The connector of claim 1 wherein said second part of said conductive pin extends beyond a surface of said electrically insulating body.

5. The connector of claim 1 wherein at least one of said wings additionally includes an aperture suitable for mounting said connector upon a structure.

* * * * *